United States Patent [19]
Prentice

[11] Patent Number: 5,606,288
[45] Date of Patent: Feb. 25, 1997

[54] DIFFERENTIAL TRANSIMPEDANCE AMPLIFIER

[75] Inventor: John S. Prentice, Palm Bay, Fla.

[73] Assignee: Harris Corporation, Melbourne, Fla.

[21] Appl. No.: 512,405

[22] Filed: Aug. 8, 1995

[51] Int. Cl.$^6$ ........................................ H03F 3/45
[52] U.S. Cl. ...................... 330/260; 330/252; 330/258
[58] Field of Search .................... 330/252, 258, 330/260

[56] References Cited

U.S. PATENT DOCUMENTS

| | | | |
|---|---|---|---|
| 3,832,646 | 8/1974 | Szabó et al. | 330/260 X |
| 4,409,556 | 10/1983 | Van Kessel | 330/260 X |
| 4,476,440 | 10/1984 | Bennett, Jr. | 330/260 |
| 5,132,640 | 7/1992 | Tanaka et al. | 330/252 |
| 5,138,276 | 8/1992 | Marks | 330/252 |

FOREIGN PATENT DOCUMENTS

| | | | |
|---|---|---|---|
| 637128 | 2/1995 | European Pat. Off. | 330/252 |
| 4098683 | 3/1992 | Japan | 330/252 |

OTHER PUBLICATIONS

Taub, "Differential Amplifier With High Input Impedance," *IBM Technical Disclosure Bulletin*, vol. 9, No. 11, Apr. 1967, pp. 1637, 1638.

*Primary Examiner*—James B. Mullins
*Attorney, Agent, or Firm*—Rogers & Killeen

[57] ABSTRACT

A circuit and method for reducing the output impedance and the common mode gain in a differential transimpedance amplifier sets the input impedance for the differential transimpedance amplifier, giving it one value for differential inputs and another value for common mode inputs. The circuit and method sets the effective input impedance for the amplifier equal to the negative of amplifier's feedback resistor impedance for differential inputs, and to low, positive value for common mode inputs.

8 Claims, 3 Drawing Sheets ial TRANSIMPEDANCE AMPLIFIER

BACKGROUND OF THE INVENTION

The present invention is directed to improvements for differential transimpedance amplifiers, and more particularly to a circuit and method for reducing the output impedance and the common mode gain in a differential transimpedance amplifier.

A differential transimpedance amplifier converts a signal current to a voltage. For example, the output of a double balanced mixer cell is a differential current (the difference between two currents.) A differential transimpedance amplifier may be used to convert this differential current to a differential output voltage.

Transimpedance accuracy may be improved by decreasing the output impedance. A transimpedance amplifier may use feedback resistors to set a desired transimpedance value, and any additional output impedance associated with the high impedance end of the feedback resistor degrades transimpedance accuracy.

Further, in many applications for transimpedance amplifiers a common mode input current is not part of the desired output signal and the presence of a common mode current, such as mixer switching noise, will also degrade transimpedance amplifier performance. A common mode input current impact on the differential output voltage can be avoided in a well designed conventional differential transimpedance amplifier, but the common mode input current will still show up as a common mode signal from either of the amplifier's outputs to ground.

It is desirable that the voltage from either amplifier output to ground be the same as the differential output voltage (that is, the voltage between the two outputs), except at one-half the magnitude. As will be appreciated, a common mode signal from an output to ground degrades the accuracy of the desired voltage from the output to ground.

A single stage, differential transimpedance amplifier typical of the prior art is depicted in FIG. 1. The feedback resistors are resistors R1 and R2. In circuit variations, resistors R5 and R6 may be connected together, instead of grounded as shown. Resistors R3, R7 and R8 may be current sinks or sources, instead of resistors as shown.

The transimpedance values for the amplifier of FIG. 1 may be determined by conventional analysis in which it may be assumed that, the impedances of resistors R7 and R8 are counted as part of the load resistance $R_{L1}$ or $R_{L2}$, the impedances of resistors R5 and R6 account for the impedances at the input including the input impedances of the transistor bases and the output impedances of any preceding stages, and that symmetry permits half circuit analysis; that is, R7=R8, $R_{L1}$=$R_{L2}$, R1=R2, R5=R6, and Q1=Q2. It will also be noted that the amplifier transconductance $g_m$ and the effective input impedance (represented by resistor R5) have different values for differential input currents (I1=−I2) and common mode input currents (I1=I2). For differential inputs, the transconductance $g_m$ of the amplifier will be $g_{m1}$, the transconductance of the transistor Q1 (recall that Q1=Q2). For common mode inputs, $g_m$ is:

$$g_m = \frac{g_{m1}}{1 + g_{m1}(2R_3)} \quad (1)$$

The loaded transimpedance is:

$$\frac{V_{out}}{I_{in}} = \frac{-R_1}{1 + \left(\frac{R_L + R_1}{R_L R_1}\right)\left(\frac{R_5 + R_1}{R_1 R_5}\right)\left(\frac{R_1^2}{g_m R_1 - 1}\right)} \quad (2)$$

the unloaded output impedance ($R_L \to \infty$) is:

$$R_{out} = \frac{R_1 + R_5}{g_m R_5 + 1} \quad (3)$$

and the loaded input impedance (the impedance as R5→∞) is:

$$R_{in} = \frac{R_L + R_1}{g_m R_L + 1} \quad (4)$$

It is desirable to improve differential transimpedance amplifier performance by decreasing output impedance and improving the rejection of common mode output voltages.

Accordingly, it is an object of the present invention to provide a novel circuit and method for improving differential transimpedance amplifier performance.

It is another object of the present invention to provide a novel circuit and method for a differential transimpedance amplifier in which an effective input impedance is generated that has one value for differential inputs and another value for common mode inputs.

It is yet another object of the present invention to provide a novel circuit and method for a differential transimpedance amplifier in which an effective input impedance is negative for differential inputs and positive for common mode inputs.

It is still another object of the present invention to provide a novel circuit and method for a differential transimpedance amplifier in which an input circuit for the amplifier sets the effective input impedance (R5) equal to the negative of the feedback resistor (R1) impedance for differential inputs.

It is a further object of the present invention to provide a novel circuit and method for a differential transimpedance amplifier in which an input circuit for the amplifier sets the effective input impedance (R5) to a low, positive value near zero for common mode inputs.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
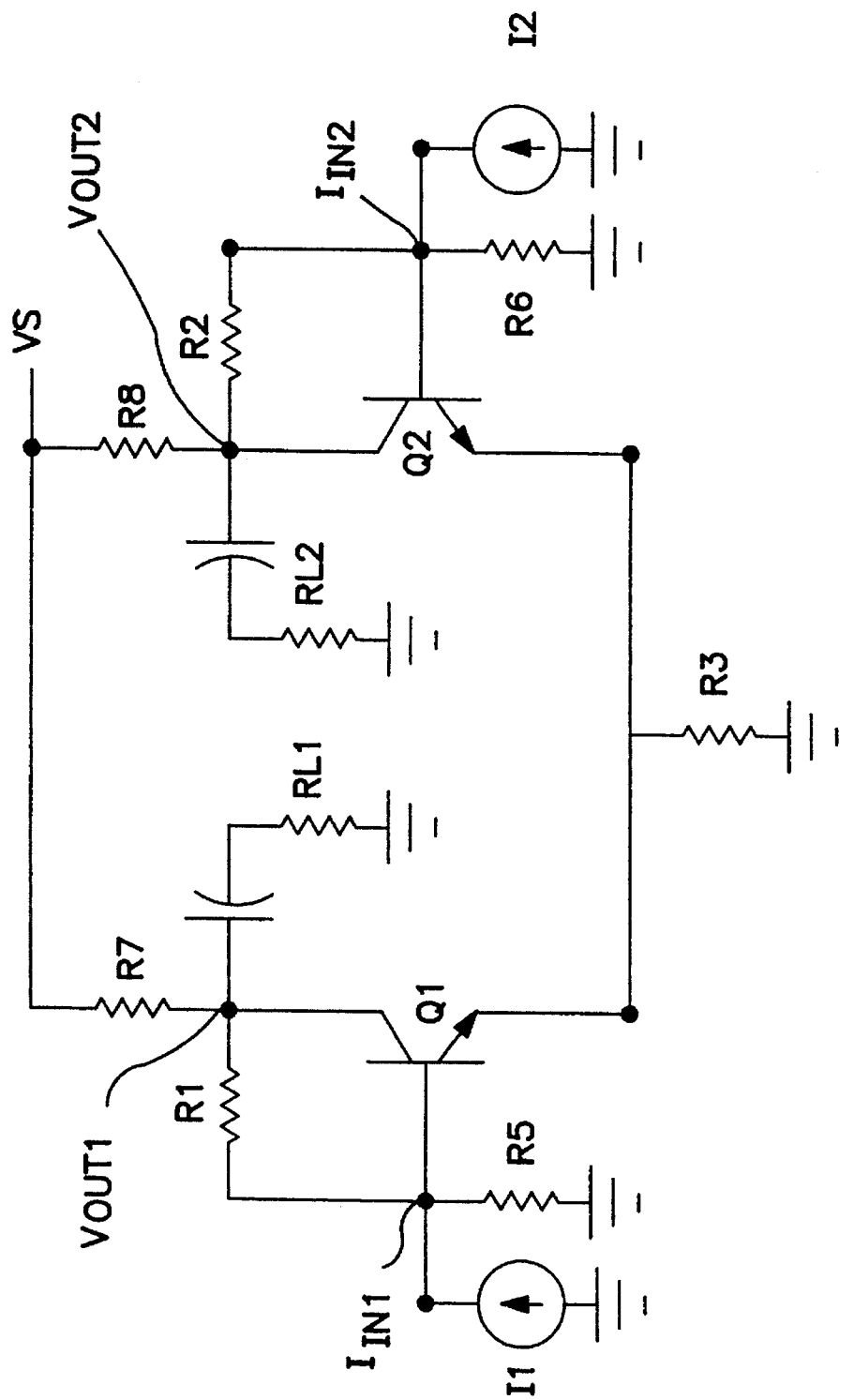
FIG. 1 is a circuit diagram of a single stage, differential transimpedance amplifier typical of the prior art.
Figure 2:
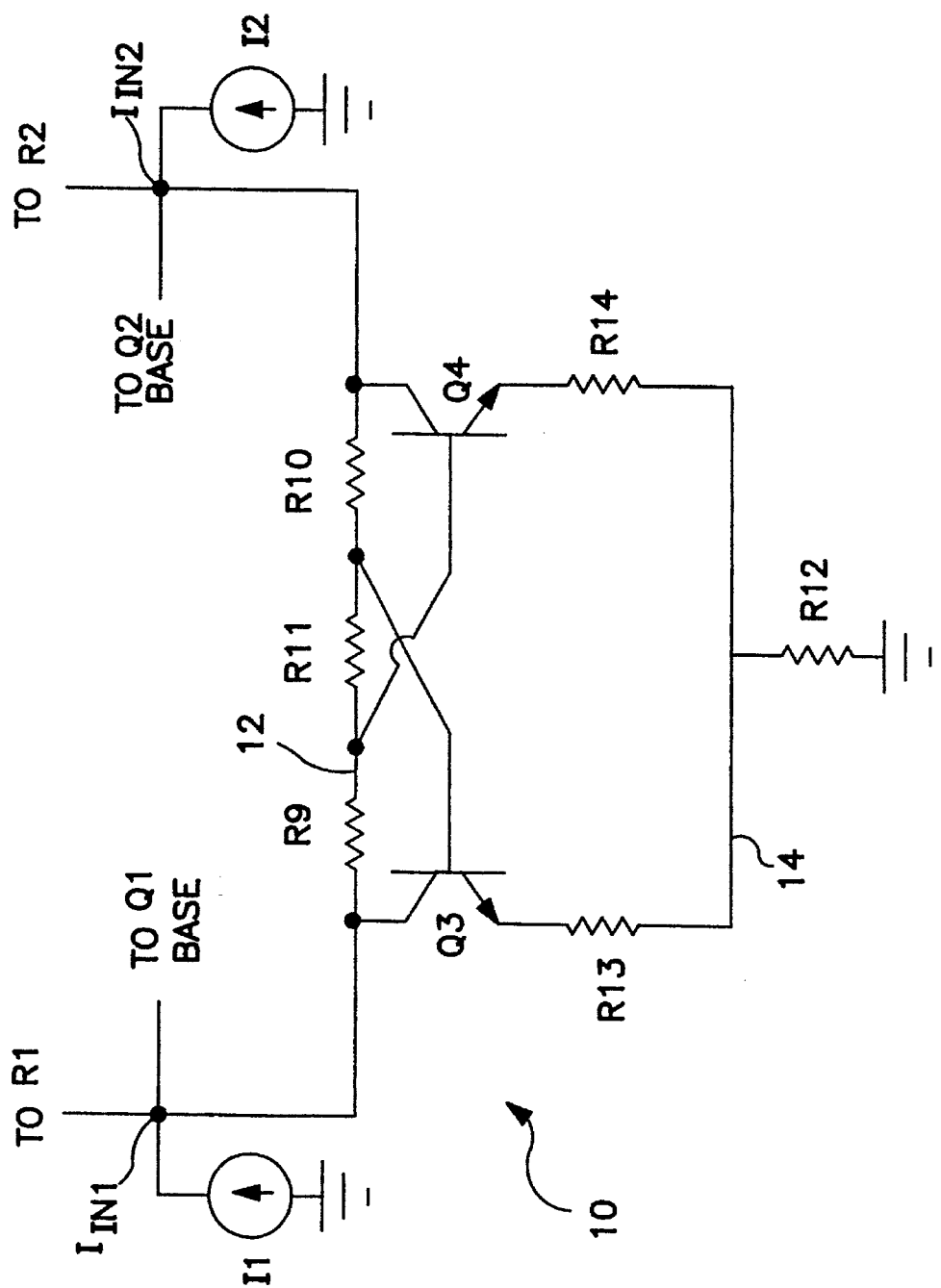
FIG. 2 is a circuit diagram of an embodiment of the circuit of the present invention for setting the effective input impedance for a differential transimpedance amplifier.

With reference now to FIG. 2, an embodiment of the present invention may include a circuit 10 that may be connected to a differential transimpedance amplifier (such as depicted in FIG. 1) at the current input nodes Iin1 and Iin2. Circuit 10 may include a resistive connection 12 between input nodes Iin1 and Iin2 that includes plural resistors R9, R10, and R11 connected in series. Resistive connection 12 may connect corresponding terminals of transistors Q3 and Q4, and the opposite terminals may be connected through a further resistive path 14 that may be grounded. The bases of transistors Q3 and Q4 may be connected to the resistive path 12. The base of transistor Q4 may be connected between resistors R9 and R11 and the base of transistor Q3 may be connected between resistors R11 and R10.

In operation, circuit 10 sets the input impedance for a differential transimpedance amplifier, giving it one value for differential inputs and another value for common mode inputs. The cross connection of the bases of transistors Q3 and Q4 gives the circuit a negative differential impedance. The net differential impedance is determined by the parallel combination of resistive connection 12 positive impedance with the transistor negative impedance. The different magnitudes of the differential and common mode impedances are made possible, in part, because resistor R12 has no effect on differential impedance while resistive connection 12 has no effect on common mode impedance.

For differential inputs, the parasitic input impedance R5 is typically high. However, if the impedance of resistor R5 is set equal to the negative of the impedance of feedback resistor R1, the load dependency is removed and the output impedance is reduced to near zero. As may be seen in equations 2 and 3, when $R_5 = -R_1$ output impedance approaches zero and there is no load dependency (the term $R_5 + R_1$ in equations 2 and 3 is zero).

For common mode inputs, there are two ways to make the value of Vout/Vin small. One way is to make the denominator of equation 2 very large by making $(R_1^2/(g_m R_1 - 1))$ large. That is, the product of amplifier transconductance $g_m$ and the impedance of R1 may be set to 1:

$$(g_m R_1 - 1) = 0 \rightarrow \frac{g_{m1} R_1}{1 + 2 g_{m1} R_3} = 1 \tag{5}$$

This may be achieved by setting the impedance of resistor R3 equal to one half the impedance of feedback resistor R1.

$$R_3 = \frac{g_{m1} R_1 - 1}{2 g_{m1}} \approx \frac{R_1}{2} \tag{6}$$

Another way to make the value of Vout/Vin small is to make $((R_5 + R_1)/R_1 R_5)$ large by making $R_1 R_5$ small. Either, or both, of these methods may be used. Regardless of the method used, the common mode value of R5 is desirably a small, positive value that is near zero. As shown in equation 7, common mode transimpedance approaches zero as the impedance of R5 approaches zero.

$$\frac{V_{out}}{I_{in}} \approx -R_5 \frac{g_m R_1}{\left(\frac{R_L + R_1}{R_L}\right)} \tag{7}$$

To facilitate an explanation of the analysis of circuit 10, it may be assumed that R9=R10, R13=R14, Q3=Q4 so that a half circuit analysis may be used. Thus, the differential impedance is:

$$R = \frac{R_9 + \frac{1}{2} R_{11}}{1 - g_m \frac{R_{11}}{2}} = \frac{2 R_9 + R_{11}}{2 - g_m R_{11}} \tag{8}$$

and the amplifier transconductance is:

$$g_m = \frac{g_{m3}}{1 + g_{m3} R_{13}} \tag{9}$$

where $g_{m3}$ is the transconductance of the transistor Q3, and where R11 may be infinite, R13 may be zero, and where $g_m R_{11} > 2$ for negative values.

The common mode impedance is:

$$R = \frac{1}{g_m} \; ; g_m = \frac{g_{m3}}{1 + g_{m3}(R_{13} + 2 R_{12})} \tag{10}$$

so that:

$$R = \frac{1}{g_{m3}} + R_{13} + 2 R_{12} \tag{11}$$

It will be noted that the circuit provides the further advantage of allowing the use of large values for emitter ballasting resistors R13 and R14 so that output offset voltage is reduced, and the operating point is stabilized against temperature and supply voltage changes.

Variations to circuit 10 may be made as appropriate, such as setting the impedances of resistors R9, R10 and R12 to zero, making R11 an open circuit, or making R9 and R10 short circuits. Resistor R12 may be a current sink.

Figure 3:
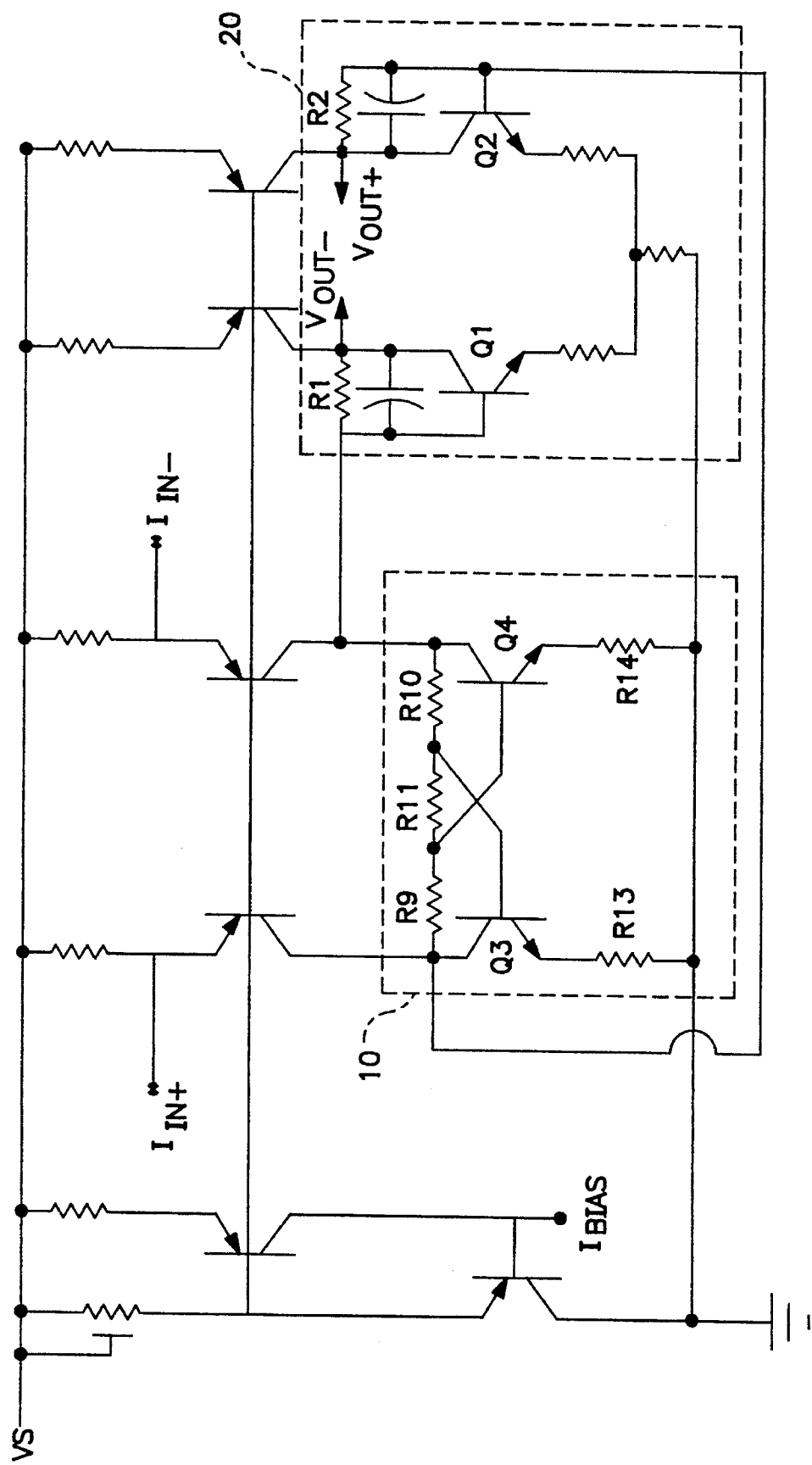
FIG. 3 is a circuit diagram of a further embodiment of the present invention illustrating an input circuit for setting input impedance and a differential transimpedance amplifier.

With reference now to FIG. 3, in which similar reference numbers have been used to designate similar features to facilitate an understanding thereof, a further embodiment of the present invention may include a differential transimpedance amplifier 20 and a circuit 10 for setting an input impedance therefore. MOSFETs may be substituted for the bipolar transistors shown, and the references herein to a "base" also refer to a MOSFET gate.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A circuit for reducing output impedance and common mode voltage gain of a differential transimpedance amplifier comprising:

first means for resistively connecting input nodes of a differential transimpedance amplifier; and two transistors, each having a first terminal connected to one of the input nodes of the differential transimpedance amplifier, a base connected to said first means, and a second terminal connected through a resistive element to ground, said first means comprising three resistors connected in series, wherein said base of one of said two transistors is connected between a first and second of said three resistors and wherein said base of the other of said two transistors is connected between the second and third of said three resistors.

2. The circuit of claim 1 wherein said third of said three resistors is adjacent the one of the input nodes that has connected thereto said first terminal of said one of said two transistors having its base connected between said first and second resistors.

3. The circuit of claim 2 wherein said first and third resistors have substantially equal impedance.

4. The circuit of claim 1 wherein said two transistors have substantially similar performance.

5. The circuit of claim 1 wherein said circuit provides a negative input impedance to differential current inputs at the input nodes of the differential transimpedance amplifier, and a positive input impedance to common mode current inputs at the input nodes of the differential transimpedance amplifier.

6. The circuit of claim 5 wherein said positive input impedance is near zero.

7. A differential transimpedance amplifier and circuit for setting an input impedance thereto, the differential transimpedance amplifier having a first input node connecting a base of one amplifier transistor and one input current, a second input node connecting a base of a further amplifier transistor and a further input current, and a feedback resistor for each said amplifier transistor, the circuit comprising:

a first transistor having one terminal connected to the first node;

a second transistor having one terminal connected to the second node;

plural resistive elements connecting the first and second nodes;

bases of said first and second transistors being connected to different interconnections of said plural resistive elements; and second terminals of said first and second transistors being connected to ground through resistive elements;

whereby output impedance of the differential transimpedance amplifier is low to improve transimpedance accuracy and common mode voltage is low.

8. The amplifier and circuit of claim 7 wherein said circuit has an effective input impedance to differential input currents that is approximately the negative of said feedback resistor.

* * * * *